United States Patent
Kim et al.

(10) Patent No.: US 9,237,618 B2
(45) Date of Patent: Jan. 12, 2016

(54) LED LIGHTING APPARATUS

(71) Applicant: SILICON WORKS CO., LTD., Daejeon-si (KR)

(72) Inventors: Yong Guen Kim, Suwon-si (KR); Sang Young Lee, Jeonju-si (KR)

(73) Assignee: SILICON WORKS CO., LTD., Daejeon-Si (KR)

( * ) Notice: Subject to any disclaimer, the term of this patent is extended or adjusted under 35 U.S.C. 154(b) by 364 days.

(21) Appl. No.: 13/907,254

(22) Filed: May 31, 2013

(65) Prior Publication Data
US 2013/0320867 A1 Dec. 5, 2013

(30) Foreign Application Priority Data

May 31, 2012 (KR) ........................ 10-2012-0058709

(51) Int. Cl.
*H05B 37/00* (2006.01)
*H05B 33/08* (2006.01)

(52) U.S. Cl.
CPC ................................... *H05B 33/083* (2013.01)

(58) Field of Classification Search
CPC ........... H05B 33/0809; H05B 33/0824; H05B 33/083
USPC ...................... 315/186, 185 R; 361/704, 688
See application file for complete search history.

(56) References Cited

U.S. PATENT DOCUMENTS

| 6,061,241 | A  | * | 5/2000 | Handforth | H04M 3/005 174/250 |
|---|---|---|---|---|---|
| 9,066,392 | B2 | * | 6/2015 | Lee | H05B 33/0824 1/1 |
| 2009/0161318 | A1 | * | 6/2009 | Sanderson | H05K 1/0203 361/709 |
| 2010/0164403 | A1 | * | 7/2010 | Liu | H05B 33/086 315/297 |
| 2010/0308739 | A1 | * | 12/2010 | Shteynberg | H05B 33/083 315/193 |
| 2011/0068700 | A1 | * | 3/2011 | Fan | H05B 33/0824 315/185 R |
| 2011/0084619 | A1 | * | 4/2011 | Gray | H05B 33/0824 315/185 R |
| 2011/0163683 | A1 | * | 7/2011 | Steele | F21K 9/135 315/192 |
| 2013/0320868 | A1 | * | 12/2013 | Kim | H05B 33/083 315/186 |

FOREIGN PATENT DOCUMENTS

| KR | 10-1005199 | 12/2010 |
|---|---|---|
| KR | 10-1062193 | 9/2011 |
| KR | 10-2011-0128426 | 11/2011 |
| KR | 10-1128680 | 3/2012 |

* cited by examiner

*Primary Examiner* — Lincoln Donovan
*Assistant Examiner* — Thomas Skibinski
(74) *Attorney, Agent, or Firm* — Kile Park Reed & Houtteman PLLC (57) ABSTRACT

Disclosed is an LED lighting apparatus capable of improving a power factor and temperature characteristics. The LED lighting apparatus according to a preferred embodiment of the present invention includes a light source having a plurality of LED channels and performs a current regulating operation to allow a light source to emit light. The light source uses a current path provided by current regulating to emit light.

16 Claims, 9 Drawing Sheets

LED LIGHTING APPARATUS

BACKGROUND OF THE INVENTION

1. Field of the Invention

The present invention relates to an LED lighting apparatus, and more particularly, to an LED lighting apparatus capable of improving a power factor and temperature characteristics.

2. Description of the Related Art

For energy saving, a lighting technology of using an LED as a light source has been continuously developed.

In particular, a high brightness LED has advantages differentiated from other light sources in terms of various factors, such as energy consumption, lifespan, light quality, and the like.

However, a lighting apparatus using an LED as a light source may require a lot of additional circuits due to a characteristic that the LED is driven by a constant current.

An example developed to solve the above problem may include an AC direct type lighting apparatus.

The AC direct type LED lighting apparatus generates a rectified voltage from a commercial AC power supply to drive the LED and immediately uses the rectified voltage as an input voltage without using an inductor and a capacitor to obtain a good power factor characteristic.

An example of the foregoing AC direct type LED apparatus is disclosed in Korean Patent No. 10-1128680.

However, as the LED lighting apparatus is increasingly spread, the lighting apparatus using an LED as a light source needs to secure low power consumption and an improved power factor and to have simple components and a simple structure.

SUMMARY OF THE INVENTION

Accordingly, the present invention has been made in an effort to solve the problems occurring in the related art, and an object of the present invention is to provide an LED lighting apparatus which has an improved power factor, provides a current path for allowing a light source including a plurality of LED channels to emit light by using a current detection voltage varying depending on the light-emitting state of the light source, and has a simple structure.

Another object of the present invention is to provide an LED lighting apparatus capable of performing sequential light-emitting or quenching for each of the plurality of LED channels connected to each other in series or improving current regulation due to light emitting or quenching for each channel.

Still another object of the present invention is to provide an LED lighting apparatus in which LED channels included in a light source are arranged in a predetermined region so as to have improved heat radiating efficiency and illumination.

In order to achieve the above object, according to one aspect of the present invention, there is provided an LED lighting apparatus, including: a power supply unit configured to convert an AC voltage and provide a rectified voltage; a light source configured to include N LED channels (N is a natural number) including at least one LED; and a constant current control circuit configured to divide a varying width of the rectified voltage into N periods in response to turn-on voltages for each LED channel, detect a current flowing in the LED channels corresponding to the period, and control the light source to emit light by controlling the light source to emit light in response to the current detected for each channel.

In order to achieve the above object, according to another aspect of the present invention, there is provided an LED lighting apparatus, including: a light source configured to include N LED channels (N is a natural number) including at least one LED configured in series, wherein the N LED channels are arranged in each region on a substrate depending to a heat radiating priority and the heat radiating priority are determined depending on a heat value by light output; and a current regulating circuit configured to provide current paths for the N LED channels at different positions in response to a variation of a rectified voltage provided to the light source, wherein the current regulating circuit includes: N switching circuits configured to be connected to each output terminal of the N LED channels in parallel to form the current paths; N current detection resistors configured to be independently connected to the N switching circuits and a ground to provide a current detection voltage; and a reference voltage generation circuit configured to generate and provide reference voltages having different levels for each of the N switching circuits, wherein the N switching circuits compare their own reference voltage with the current detection voltage corresponding thereto to selectively provide the current paths.

In order to achieve the above object, according to still another aspect of the present invention, there is provided an LED lighting apparatus, including: a light source configured to include N LED channels (N is a natural number) including at least one LED configured in series, wherein the N LED channels are arranged in each region on a substrate depending to a heat radiating priority and the heat radiating priority is determined depending on a heat value by light output; and a current regulating circuit configured to provide current paths for the N LED channels at different positions in response to a variation of a rectified voltage provided to the light source, wherein the current regulating circuit includes: N switching circuits configured to be connected to each output terminal of the N LED channels in parallel to form the current paths; N current detection resistors configured to be independently connected to the N switching circuits and a ground to provide a current detection voltage; and a reference voltage generation circuit configured to commonly provide a reference voltage having a fixed level to each switching circuit, wherein the N switching circuits compare the reference voltage with the current detection voltage corresponding thereto to selectively provide the current paths.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENTS

Hereinafter, preferred embodiments of the present invention will be described in detail with reference to the accompanying drawings. Terms used in the present specification and claims is not to be construed as a general or dictionary meaning and is to be construed as meaning and concept meeting technical matters of the present invention.

A preferred embodiment disclosed in the present specification and a configuration illustrated in the drawings are the preferred embodiment of the present invention and do not represent the all technical matters of the present invention and therefore various equivalents and modifications replacing these technical matters at the time of the present application may be implemented.

An LED lighting apparatus according to a preferred embodiment of the present invention is implemented as an AC direct type.

The preferred embodiment of the present invention discloses a configuration of detecting a change in current in response to a rectified voltage with a current detection voltage and controlling current paths for each of the plurality (N number, wherein N is a natural number) of LED channels connected to each other in series to control a light source to emit light.

Figure 1:
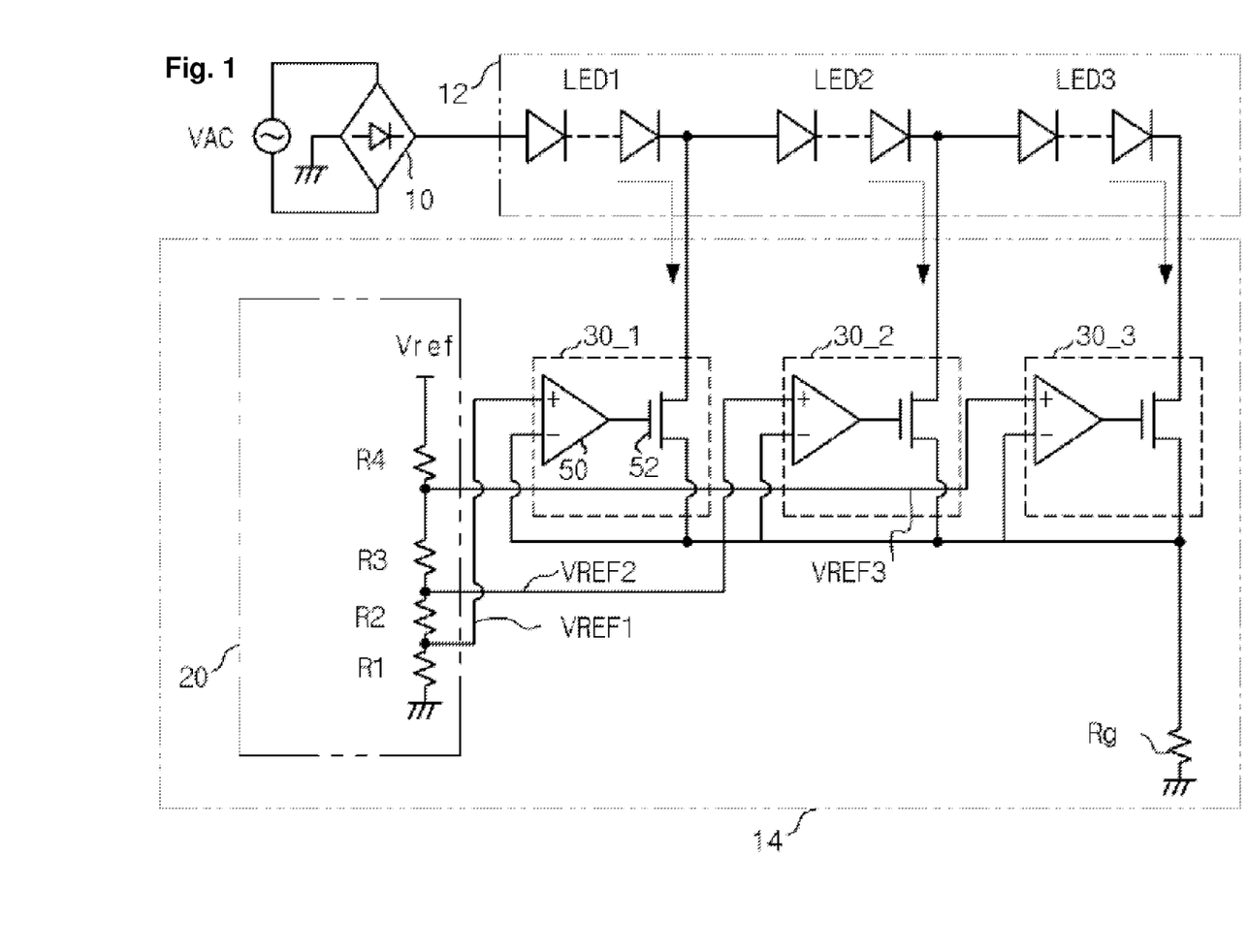
FIG. 1 is a circuit diagram illustrating an LED lighting apparatus according to a preferred embodiment of the present invention.

Referring to FIG. 1, a LED lighting apparatus according to a preferred embodiment of the present invention may include a power supply unit, a light source 12, and a current control circuit 14.

The power supply unit converts an AC voltage applied from the outer side to output a rectified voltage and may include an AC power supply VAC which supplies an AC voltage and a rectifying circuit 10 which rectifies the AC voltage to output the rectified voltage. Herein, the AC power supply VAC may be a commercial AC power supply.

The rectifying circuit 10 performs a full-wave rectification on an AC voltage having a sine wave of the AC power supply VAC to output the rectified voltage. Therefore, the rectified voltage has a ripple component which increases and decreases a voltage level in a unit of a half period of the commercial AC voltage.

The light source 12 includes three LED channels LED1, LED2, and LED3 connected to each other in series. The three LED channels LED1, LED2, and LED3 each include at least one LED connected to each other in series. Further, the three LED channels LED1, LED2, and LED3 may each include the same or different LEDs and a dotted line illustrated in FIG. 1 for each LED channel LED1, LED2, and LED3 represents that the illustration of the LEDs are omitted.

The preferred embodiment of the present invention illustrates that the light source 12 includes the three LED channels LED1, LED2, and LED3 but is not limited thereto, and therefore may be applied to the case in which the light source 12 includes a various number of LED channels.

Further, the current control circuit 14 is a current regulating circuit and detects a change in a rectified voltage with the current detection voltage so as to provide a current path for regulating a current. Therefore, the current control circuit 14 serves to control the light source 12 to emit light in response to the current rectified voltage state.

The light-emitting of the three LED channels LED1, LED2, and LED3 included in the light source 12 is controlled by the current control circuit 14.

In more detail, when the rectified voltage rises, the three LED channels LED1, LED2, and LED3 is configured to be sequentially light-emitted from one applied with the rectified voltage to another farthest away therefrom and the number of light-emitted LED channels increases. When the rectified voltage falls, the three LED channels LED1, LED2, and LED3 are sequentially quenched from another farthest away from one applied with the rectified voltage and the number of quenched LEDs decreases. In this case, the current control circuit 14 forms the current paths in the LED channels corresponding to the current light-emitting voltage state.

As described above, the light-emitting of the light source 12 may be controlled by the current control circuit 14 and the current control circuit 14 may include a reference voltage generation circuit 20, a current detection resistor Rg, and three switching circuits 30_1, 30_2, and 30_3. In this configuration, the reference voltage generation circuit 20 includes a plurality of resistors R1, R2, . . . , R4 which are applied with a constant voltage Vref and connected to each other in series.

The resistor R1 is connected to a ground and the resistor R4 is applied with the constant voltage Vref. The resistor R4 serves as a load resistor for adjusting an output. The resistors R1, R2, and R3 are to output reference voltages VREF1, VREF2, and VREF3 having different levels. Among the reference voltages VREF1, VREF2, and VREF3, the reference voltage VREF1 has the lowest voltage level and the reference voltage VREF3 has the highest voltage level.

Figure 2:
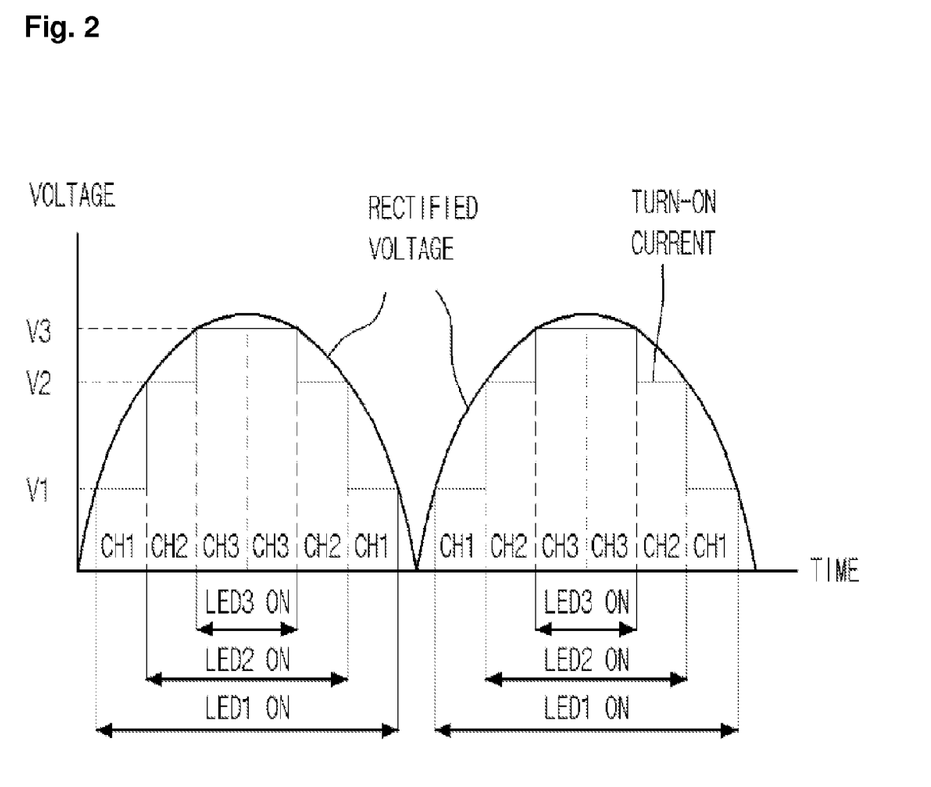
FIG. 2 is a waveform diagram illustrating operation characteristics of a driving apparatus of FIG. 1.

That is, as illustrated in FIG. 2, each resistor R1, R2, and R3 may be set to output the three reference voltages VREF1, VREF2, and VREF3 having gradually increasing levels in response to the rising of the rectified voltage to the three LED channels LED1, LED2, and LED3.

In more detail, the three reference voltages VREF1, VREF2, and VREF3 may be generated to have levels for forming the current paths for light-emitting or quenching the three LED channels LED1, LED2, and LED3 connected to each of the three switching circuits 30_1, 30_2, and 30_3.

The reference voltage VREF1 has a level to turn off the switching circuit 30_1 when the LED channel LED2 is light-emitted. In more detail, the reference voltage VREF1 may be set to a level lower than that of the current detection voltage formed in the current detection resistor Rg by the light-emitting voltage V2 of the LED channel LED2.

Further, the reference voltage VREF2 has a level to turn off the switching circuit 30_2 when the LED channel LED3 is light-emitted. In more detail, the reference voltage VREF2 may be set to a level lower than that of the current detection voltage formed in the current detection resistor Rg by a light-emitting voltage V3 of the LED channel LED3.

Further, the reference voltage VREF3 ensures the stable light-emitting of the LED channel LED3 in an upper bound level region of the rectified voltage. The level of the reference voltage VREF3 may be set in consideration of the turn off of the switching circuit 30_3 in response to the overvoltage of the rectified voltage. Herein, the upper bound level region of the rectified voltage may be defined as a level higher than that of the light-emitting voltage V3.

Further, the light-emitting voltages V1, V2, and V3 for each of the three LED channels LED1, LED2, and LED3 may be defined as a voltage required for the light-emitting of each channel.

In more detail, the light-emitting voltage V1 of the LED channel LED1 may be defined as a level to turn on the LEDs included in the LED channel LED1. Further, the light-emitting voltage V2 of the LED channel LED2 may be defined as a level to allow the LEDs included in the LED channels LED1 and LED2 to be light-emitted. Further, the light-emitting voltage V3 of the LED channel LED3 may be defined as a level to turn on the LEDs included in the three LED channels LED1, LED2, and LED3.

Further, a variable width of the rectified voltage may be divided into three periods based on the light-emitting voltages V1, V2, and V3 and when the rectified voltage enters the above specific period due to the rising or falling thereof, the LED channels corresponding to the corresponding period may be turned on by the operation of the corresponding switching circuit.

FIG. 2 is a waveform diagram illustrating the case in which the three LEDs LED1, LED2, and LED3 are driven, which is to illustrate the correlation of the rectified voltage, the turn on current, and the light-emitting voltage.

It can be appreciated from FIG. 2 that the rectified voltage has periods CH1, CH2, and CH3 divided based on voltage values, that is, the light-emitting voltages V1, V2, and V3 when the LED channels LED1, LED2, and LED3 are light-emitted and the turn on current having different levels for each period CH1, CH2, and CH3 is maintained as a constant current state.

The preferred embodiment of the present invention illustrated in FIGS. 1 and 2 illustrates a configuration and an operation of the LED lighting apparatus using the three LED channels, but the LED lighting apparatus may be configured by increasing the number of LED channels to N according to manufacturer's intention. As a result, the channels of FIG. 2 may be subdivided, such that the level of the reference voltage may be designed to follow up the change in the rectified voltage.

Meanwhile, the three switching circuits 30_1, 30_2, and 30_3 are connected to each LED channels LED1, LED2, and LED3 in parallel and each switching circuit 30_1, 30_2, and 30_3 is connected between grounds to commonly connect to the current detection resistor Rg providing the current detection voltage.

Further, the three switching circuits 30_1, 30_2, and 30_3 provides a single current path for allowing the light source 12 to emit light.

The three switching circuits 30_1, 30_2, and 30_3 compare their own reference voltage with the current detection voltage of the current detection resistor Rg and when the current detection voltage meets turn on conditions, are turned on and when the current detection voltage rises beyond the turn on conditions, are turned off.

The three reference voltages VREF1, VREF2, and VREF3 have the increased level in the switching circuits 30_1, 30_2, and 30_3 connected to the LED channels LED1, LED2, and LED3 which are far away from a position to which the rectified voltage is applied. In other words, when the number of LED channels included in the light source is N, the level of the reference voltage applied to the switching circuit corresponding to an N-th LED channel is higher than that of the reference voltage applied to the switching circuit corresponding to an N−1-th LED channel.

Each switching circuit 30_1, 30_2, and 30_3 includes comparators 50 which compare the reference voltage corresponding thereto with the current detection voltage applied to the current detection resistor Rg and switching elements which turn on/off the current paths between the LED channels connected thereto and the current detection resistor Rg by outputs of the comparators 50. In this configuration, the switching element may be configured of an NMOS transistor 52.

Negative (−) terminals of the comparators 50 of each switching circuit 30_1, 30_2, and 30_3 are commonly connected to the current detection resistor Rg so as to apply the current detection voltage.

Positive (+) terminals of the comparators 50 of each switching circuit 30_1, 30_2, and 30_3 are configured to be applied with the corresponding reference voltages VREF1, VREF2, and VREF3 which are applied from the reference voltage generation circuit 14.

NMOS transistors 52 of each switching circuit 30_1, 30_2, and 30_3 are configured to have sources connected to output terminals of the corresponding LED channels LED1, LED2, and LED3, respectively, gates connected to output terminals of the comparators 50, and drains commonly connected to the negative (−) terminals of the comparators and the current detection resistor Rg.

By the above configuration, each switching circuit 30_1, 30_2, and 30_3 compares the reference voltages VREF1, VREF2, and VREF3 corresponding thereto with the current detection voltage of the current detection resistor Rg and when the compared results meet the turn on conditions, is turned on.

That is, in each switching circuit 30_1, 30_2, and 30_3, the comparators 50 compare the reference voltage corresponding thereto with the detection voltage of the current detection resistor Rg and when the compared results meet the turn on conditions, outputs a signal having a level to turn on the NMOS transistor 52, such that the NMOS transistors 52 may be turned on according to the outputs of the comparators 50.

The current detection resistor Rg is applied with the current from the turned on switching circuit and the current detection voltage of the current detection resistor Rg has an increasing level as a current inflow amount increases in response to the rising of the rectified current and a decreasing level as a current inflow amount decreases in response to the falling of the rectified voltage.

A detailed operation of the preferred embodiment of the present invention configured as illustrated in FIG. 1 will be described.

The preferred embodiment of the present invention controls the current regulating and the formation of the current path to control the light-emitting of the LED channel.

When the rectified voltage is in an initial state, the LED channels are not light-emitted. Further, the current detection resistor Rg provides a low-level current detection voltage. Herein, the initial state of the rectified voltage may be defined as a state in which the level of the rectified voltage is lower than that of the light-emitting voltage V1 light emitting the LED channel LED1.

When the rectified voltage is in an initial state, all the switching circuit 30_1, 30_2, and 30_3 maintains the turned on state since the reference voltages VREF1, VREF2, and VREF3 applied to positive (+) input terminals is higher than that of the current detection voltage applied to negative (−) input terminals.

Even though all the switching circuits 30_1, 30_2, and 30_3 are initially maintained in the turned on state, when the rectified voltage does not reach the light-emitting voltage V1 to allow the LED channel LED1 to be light-emitted, the light source 12 does not emit light and the current path is not also formed.

When the rectified voltage rises to reach the light-emitting voltage V1 to allow the LED channel LED1 to be light-emitted, the turned on switching circuit 30_1 of the current control circuit 14 connected to the LED channel LED1 provides the current path and the LED channel LED1 is light-emitted. As described above, when the rectified voltage reaches the light-emitting voltage V1 to allow the LED channel LED1 to be light-emitted, the level of the current detection voltage of the current detection resistor Rg increases due to the flow of current through the switching circuit 30_1 providing the current path. In this case, however, since the level of the current detection voltage is low, the turned on state of the switching circuits 30_1, 30_2, and 30_3 is not changed.

Thereafter, the rectified voltage continuously rises, and thus the current of the output terminal of the LED channel LED1 increases and when the switching circuit 30_1 exceeds a threshold value of a current amount maintaining the turned on state, the current detection voltage of the current detection resistor Rg rises, and thus the switching circuit 30_1 is turned off. In this case, the voltage of the input terminal of the LED channel LED2 reaches the light-emitting voltage V2, the LED channel LED2 is light-emitted, and the current path for light-emitting the LED channel LED2 is formed by the turned on switching circuit 30_2.

In this case, the LED channel LED1 also maintains the light-emitting state.

The turn off of the switching circuit 30_1 is due to the increase in the level of the current detection voltage of the current detection resistor Rg. That is, as described above, when the rectified voltage reaches the light-emitting voltage V2 to allow the LED channel LED2 to be light-emitted, the level of the current detection voltage of the current detection resistor Rg increases due to the flow of current through the switching circuit 30_2 providing the current path. In this case, the level of the current detection voltage is higher than that of the reference voltage VREF1. Therefore, the NMOS transistor 52 of the switching circuit 30_1 is turned off by the output of the comparator 50. That is, the switching circuit 30_1 is turned off and the switching circuit 30_2 provides the selective current path corresponding to the light-emitting of the LED channel LED2.

Thereafter, the rectified voltage continuously rises, and thus the current of the output terminal of the LED channel LED2 increases and when the switching circuit 30_2 exceeds a threshold value of a current amount maintaining the turned on state, the current detection voltage of the current detection resistor Rg rises, and thus the switching circuit 30_2 is turned off. In this case, the voltage of the input terminal of the LED channel LED3 reaches the light-emitting voltage V3, the LED channel LED3 is light-emitted, and the current path for light-emitting the LED channel LED3 is formed by the turned on switching circuit 30_3.

In this case, the LED channels LED1 and LED2 also maintain the light-emitting state.

The turn off of the switching circuit 30_2 is due to the increase in the level of the current detection voltage of the current detection resistor Rg. That is, as described above, when the rectified voltage reaches the light-emitting voltage V3 to allow the LED channel LED3 to be light-emitted, the level of the current detection voltage of the current detection resistor Rg increases due to the flow of current through the switching circuit 30_3. In this case, the level of the current detection voltage is higher than that of the reference voltage VREF1. Therefore, the NMOS transistor 52 of the switching circuit 30_1 is turned off by the output of the comparator 50. That is, the switching circuit 30_1 is turned off and the switching circuit 30_2 provides the selective current path corresponding to the light-emitting of the LED channel LED2.

Thereafter, even though the rectified voltage continuously rises, the reference voltage VREF3 provided to the switching circuit 30_3 has a level higher than that of the current detection voltage formed in the current detection resistor Rg by the upper bound level of the rectified voltage, such that the switching circuit 30_3 may maintain the turned on state.

As described above, when the LED channels LED1, LED2, and LED3 are sequentially light-emitted in response to the rising of the rectified voltage, the turn on current corresponding to the light-emitting state increases gradually as illustrated in FIG. 2. That is, since the current control circuit 14 performs the constant current regulating operation, current corresponding to the light-emitting for each LED channel maintains a constant level and when the number of light-emitted LED channels increases, the current level increases accordingly.

As described above, the rectified voltage rises to the upper bound level and starts to fall.

When the rectified voltage starts to decrease from the upper bound level and decreases to a light-emitting voltage VCH3 or smaller, the LED channel LED3 is hard to maintain the light-emitting. In this case, the switching circuit 30_2 is turned on by the falling of the current detection voltage of the current detection resistor Rg. Therefore, the LED channel LED3 is quenched and the light-emitting thereof is maintained by the LED channels LED2 and LED1. The current path for light-emitting the LED channels LED2 and LED1 is provided by the turned on switching circuit 30_2. Thereafter, when the rectified voltage sequentially falls to the light-emitting voltage V2 and the light-emitting voltage V1 or less by the falling of the rectified voltage, the LED channels LED2 and LED1 of a lighting 10 are sequentially quenched.

The current control circuit 14 shifts the selective current path formed by the switching circuits 30_3, 30_2, and 30_1 in response to the sequential quenching of the LED channels LED3, LED2, and LED1 of the lighting 10. Further, the level of the turn on current also decreases gradually in response to the quenching state of the LED channels LED3, LED 2, and LED1.

As described above, the preferred embodiment of the present invention may sequentially perform the light-emitting and quenching of the LED channels in response to the rising and falling of the rectified voltage and control the current regulating and the current path formation in response to the light-emitting and quenching of the LED channels.

As described above, according to the preferred embodiment of the present invention, the LED channels LED1, LED2, and LED3 may be sequentially light-emitted or quenched in response to the variation of the current detection voltage and the rising and falling of the rectified voltage due to a current flowing in the single current detection resistor Rg. That is, the LED channels LED1, LED2, and LED3 may be additionally turned on one by one to a position far away from a position at which the rectified voltage is applied and may be additionally turned off one by one in an opposite direction thereto.

Therefore, the preferred embodiment of the present invention does not use an inductor, a capacitor, and the like as well as applies the current detection voltage in proportion to the rectified voltage to each channel, thereby securing the optimal power factor and securing the sufficient current regulating characteristics.

Further, the preferred embodiment of the present invention uses the single current detection resistor to form the current paths for each LED channel to simplify components configuring the LED driving circuit, such that the circuit may be implemented to have a simple structure.

Meanwhile, the preferred embodiment of the present invention improves the aligned state of the LED channels included in the light source 12, which is arranged in a predetermined region on the substrate, thereby improving heat radiating efficiency and illumination.

Figure 3:
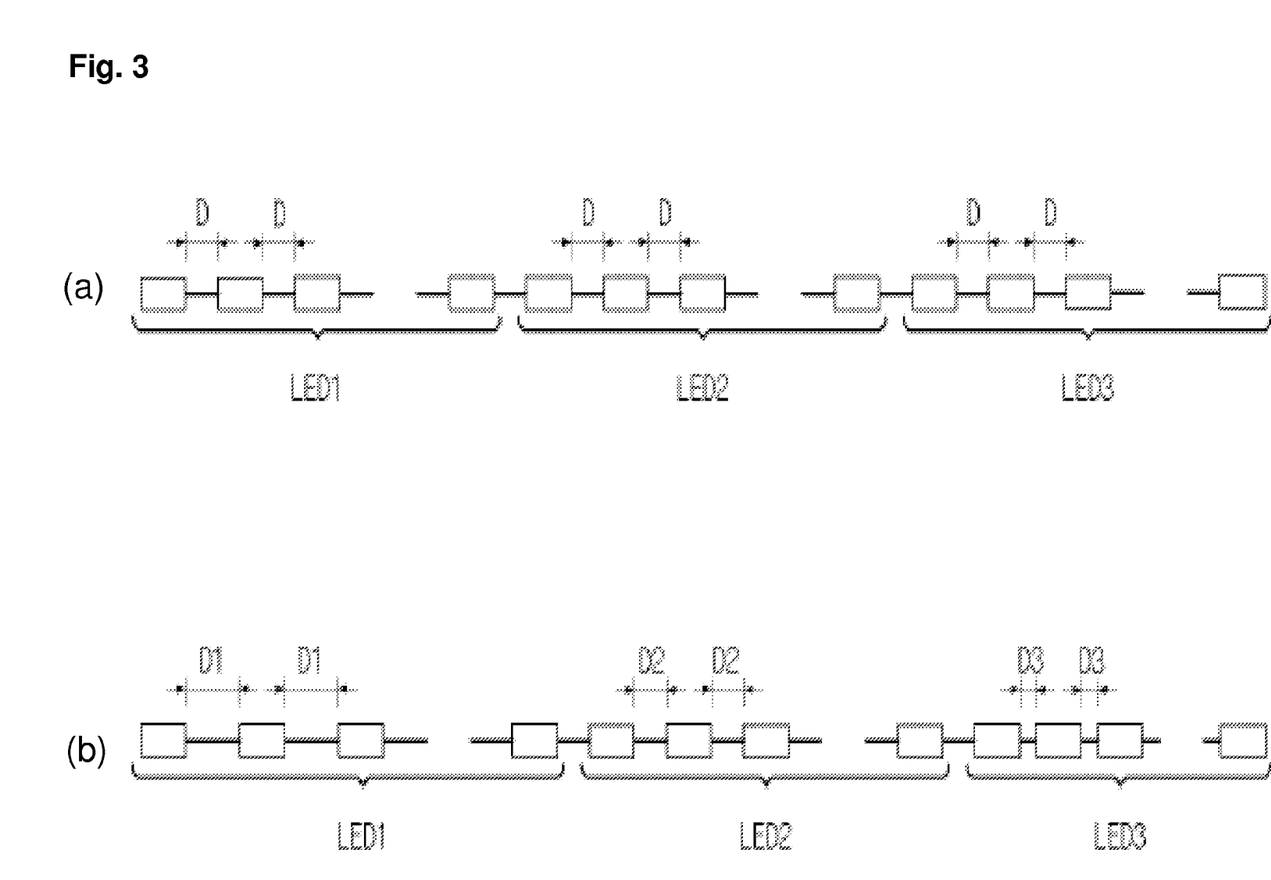
FIG. 3 is a layout illustrating a method of arranging LEDs for LED channels of a light source.

According to the preferred embodiment of the present invention, as illustrated in FIG. 3A, the LEDs for the three LED channels included in the light source 12 may be arranged at a uniform distance D.

Unlike this, according to the preferred embodiment of the present invention, as illustrated in FIG. 3B, the LEDs may be arranged at a different distances D1>D2>D3 for each of the three LED channels included in the light source 12.

Further, the three LED channels arranged as illustrated in FIGS. 3A and 3B may be arranged in a helical form in within a predetermined region on a plane substrate 100.

As can be appreciated from the description of FIGS. 1 and 2, since the LED channel LED1 firstly connected to the power supply apparatus maintains the light-emitting state for the longest time, the LED channel LED1 generates the most heat Further, since the LED channel LED3 finally connected to the power supply apparatus has the reduced time to sequentially maintain the light-emitting state and the reduced heat value, the LED channel LED3 maintains the light-emitting state for the shortest time and generates the smallest heat.

In the above description, since the LED channel LED1 light-emitted for the longest time most needs heat radiating, the LED channel LED1 has the higher heat radiating priority and since the LED channel LED3 maintaining the light-emitting state for the shortest time generates the smallest heat, the LED channel LED3 has the lower heat radiating priority.

Figure 4:
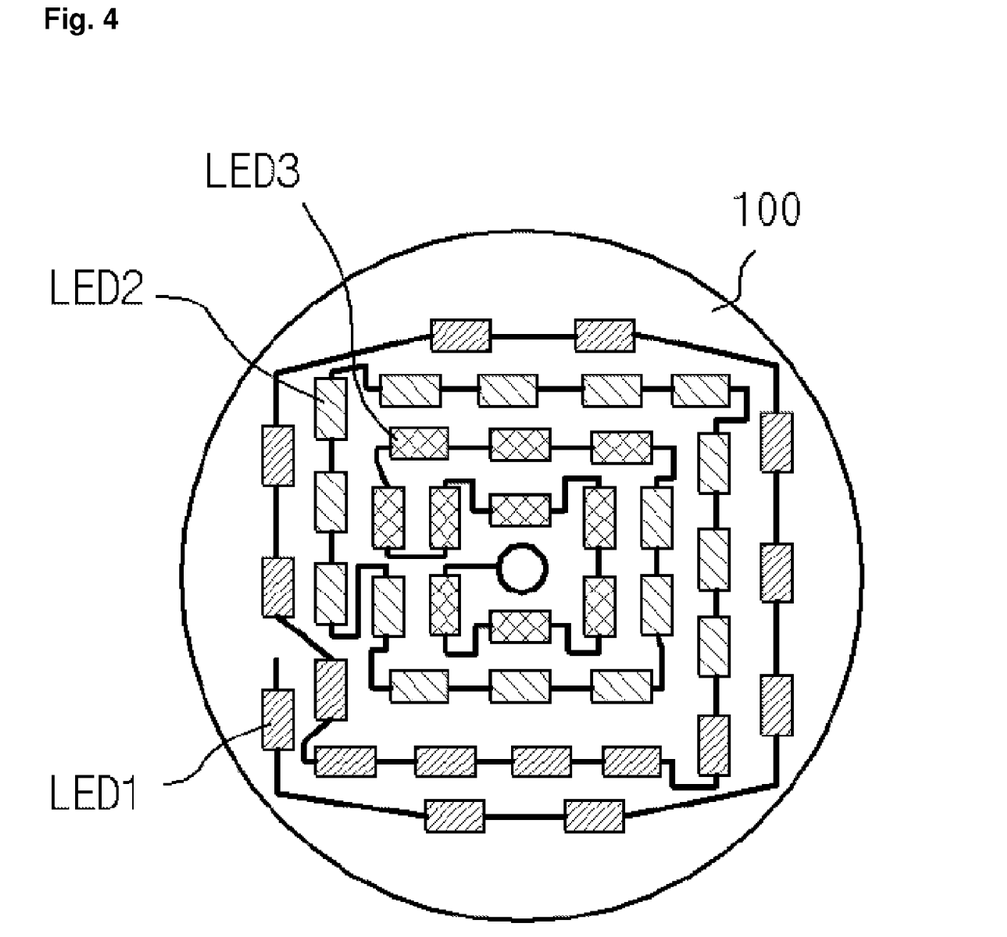
FIG. 4 is a layout illustrating an example in which the LED channels of the light source are arranged on a predetermined region of a substrate.

Therefore, as illustrated in FIG. 4, when N LED channels are arranged in a helical form on the plane substrate 100, according to the preferred embodiment of the present invention, the LED channel LED1 firstly connected to the power supply apparatus to have the higher heat radiating priority generating the most heat is arranged at the outer side and the LED channels sequentially connected thereto may be configured to be gradually arranged in the inner side.

Figure 5:
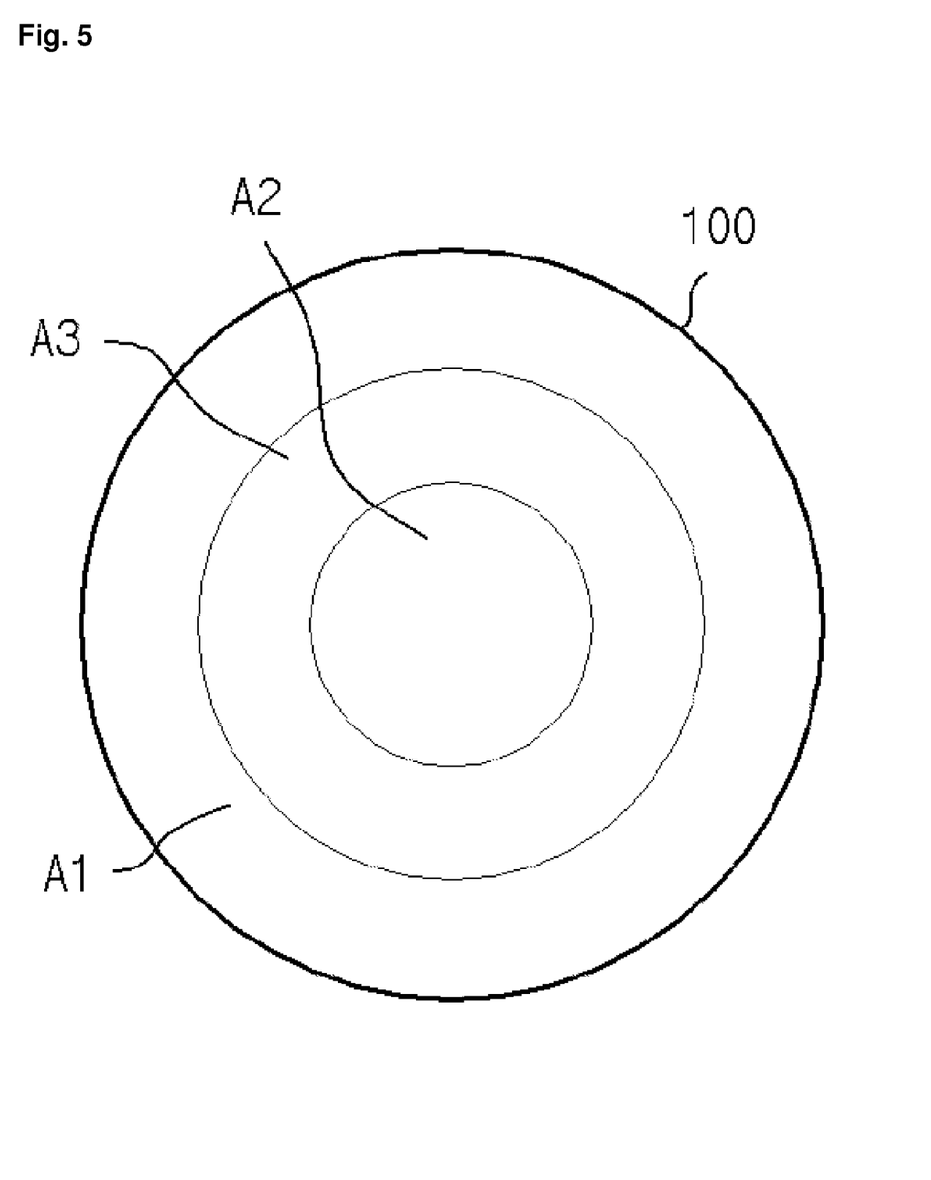
FIG. 5 is a diagram illustrating an example in which the substrate of FIG. 4 is divided into three regions.

In more detail, according to the preferred embodiment of the present invention, when the light source 12 includes the three LED channels LED1, LED2, and LED3, as illustrated in FIGS. 4 and 6A to 6C, the LED channel LED1 firstly connected to the power supply apparatus is arranged at the outermost side A1 of FIG. 5, and then the LED channels LED2 and LED3 connected thereto in order may be gradually arranged in a region A3 between the outermost side A1 and the center A2 and at a center A2.

Figure 6:
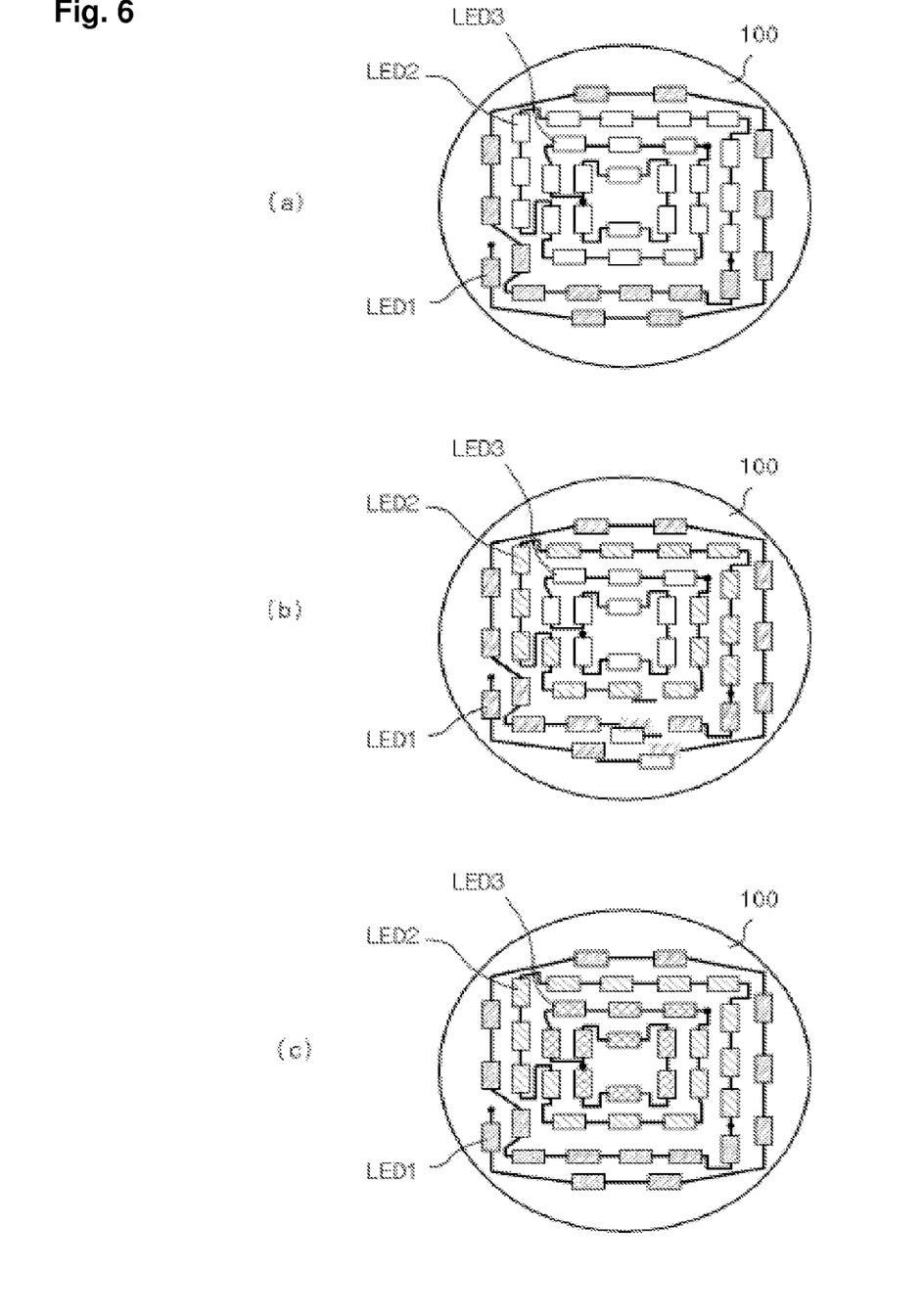
FIG. 6 is a layout illustrating light-emitting states by the arrangement of FIG. 4.

Therefore, the LED channels LED1, LED2, and LED3 included in the light source 12 may be light-emitted in an order of FIGS. 6A to 6C in response to the rising of the rectified voltage.

According to the preferred embodiment of the present invention configured as illustrated in FIGS. 4 and 6A to 6C, the LED channel having a large heat value due to the long light-emitting time is arranged at the outer side, such that the heat radiating space may be secured. Therefore, the heat radiating efficiency of the lighting apparatus may be improved.

For implementing the more efficient heat radiating, the LED channels LED1, LED2, and LED3 illustrated in FIGS. 4 and 6A to 6C may be arranged so that a spacing between the LEDs included in the LED channel located at the outer side may be arranged to be gradually wider than a spacing of the LEDs included in the LED channel located in the inner side illustrated in FIG. 3B.

Figure 7:
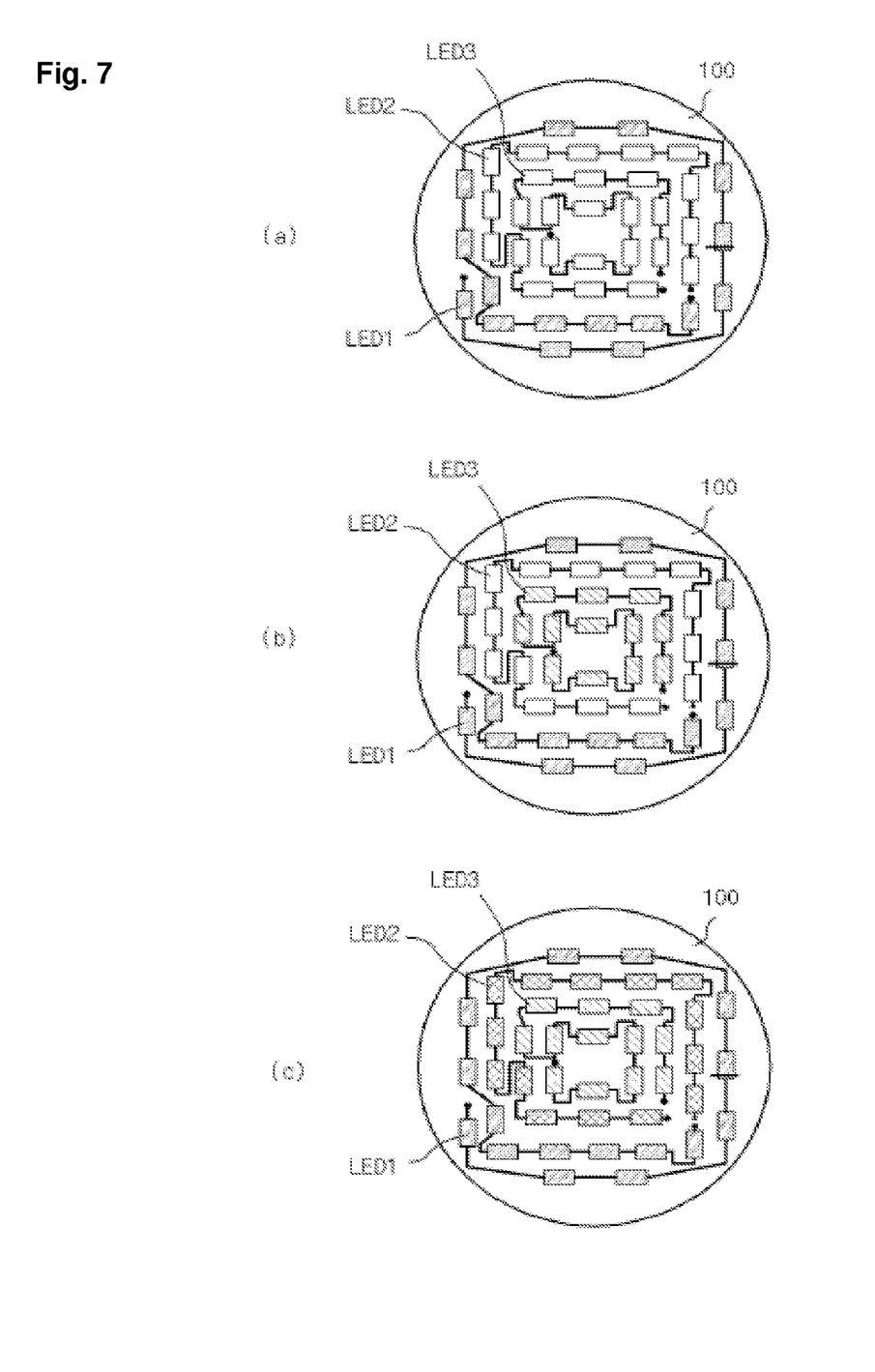
FIG. 7 is a layout illustrating light-emitting states of LED channels by an arrangement different from FIG. 4.

Further, according to the preferred embodiment of the present invention, the LED channels LED1, LED2, and LED3 as illustrated in FIGS. 7A to 7C may be arranged.

FIGS. 7A to 7C illustrate that the LED channel LED1 firstly connected to the power supply apparatus is arranged at the outermost side A1 of FIG. 5, the LED channel LED2 secondly connected thereto is arranged at the center A2 of FIG. 5, and the LED channel LED3 finally connected thereto is arranged in the region A3 between the outermost side A1 and the center A2 of FIG. 5.

Therefore, according to the preferred embodiment of FIG. 7, the LED channel LED1 at the outermost A1 is light-emitted in response to the rising of the rectified voltage, the LED channel LED2 at the center A2 is light-emitted, and finally, the LED channel LED3 in the region A3 between the outermost side A1 and the center A2 is light-emitted.

According to the preferred embodiment of FIG. 7, as the LED channel LED3 having the short light-emitting time is arranged in the region A3 between the outermost side A1 and the center A2, the heat radiating space between the LED channel LED1 having the largest heat value and the LED channel LED2 having the second largest heat value during the quenching of the LED channel LED3 may be secured.

Further, according to the preferred embodiment of the present invention, as the light-emitting is progressed to the outermost side A1, the center A2, and the region A3 therebetween, the light-emitting state may be dispersed, thereby improving the front illumination of the lighting apparatus.

In configuring the preferred embodiment of FIG. 7, when it is difficult to connect the LED channel LED1 to the LED channel LED3 in a two dimension, the electrical connection between respective channels may be implemented by using a connection member, such as a jumper. In this case, each LED channel LED1, LED2, and LED3 may have a pattern in which wirings for each channel are disconnected in a two dimension.

Figure 8:
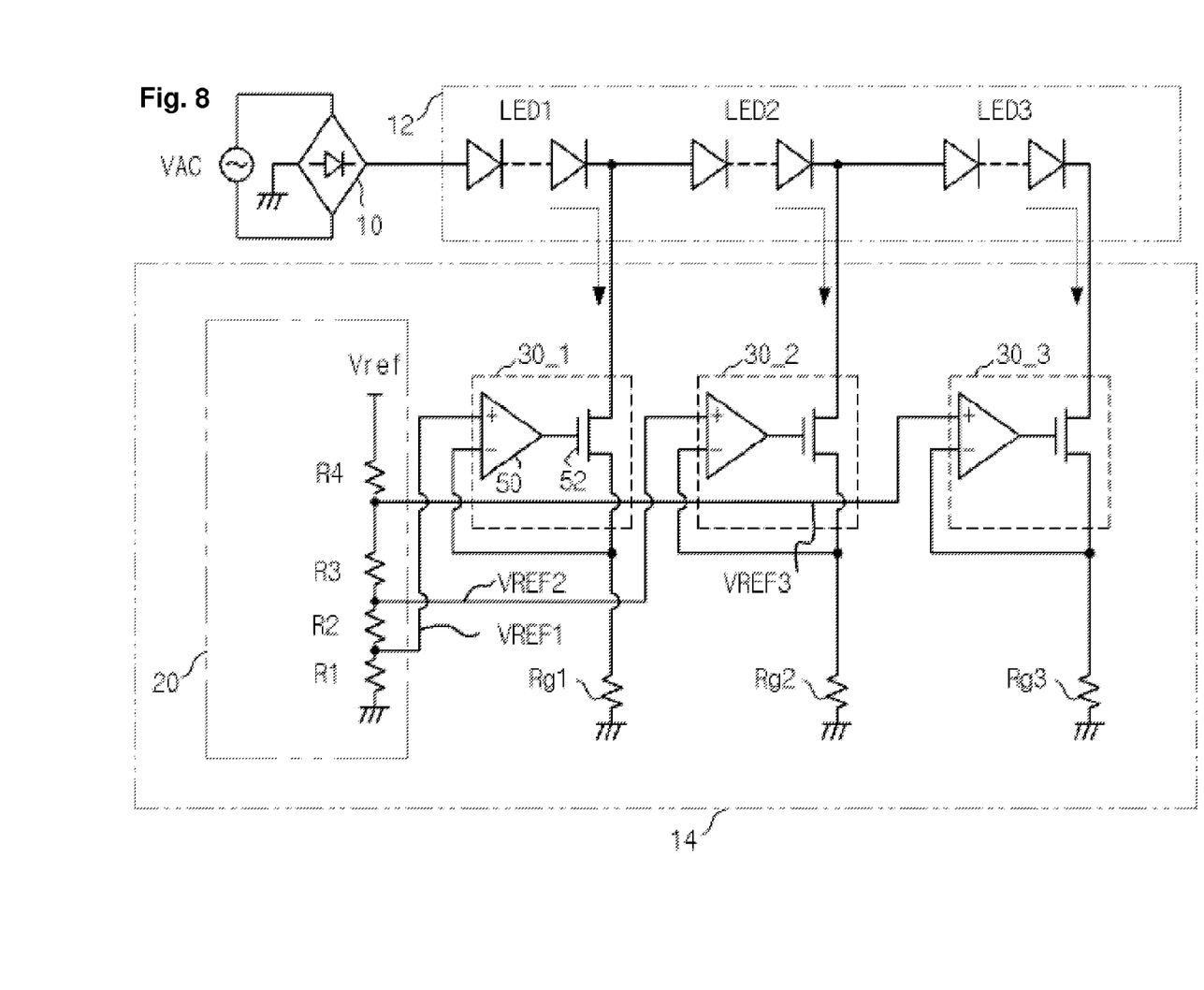
FIG. 8 is a circuit diagram illustrating an LED lighting apparatus according to another preferred embodiment of the present invention.

Meanwhile, the preferred embodiment of the present invention may be performed by a configuration adopting independent current detection resistors for each of the three LED channels LED1, LED2, and LED3 as illustrated in FIG. 8.

The preferred embodiment of FIG. 8 is different from the preferred embodiment of FIG. 1 in terms of the configuration of current detection resistors Rg1, Rg2, and Rg3 independently connected to each switching circuit 30_1, 30_2, and 30_3, instead of the configuration of the current detection resistor Rg, but the remaining components of the preferred embodiment of FIG. 8 are the same as those of the preferred embodiment of FIG. 1, and therefore the configuration and operation of the components will not be repeatedly described.

In the configuration of FIG. 8, the three current detection resistors Rg1, Rg2, and Rg3 may have uniform resistance values so as to satisfy the turn on conditions for each of the switching circuits 30_1, 30_2, and 30_3.

The reference voltages VREF1, VREF2, and VREF3 applied to the three switching circuits 30_1, 30_2, and 30_3 are provided to have a high voltage as being far away from the position at which the rectified voltage is applied. The light-emitting voltage for the three LED channels LED1, LED2, and LED3 rises as being far away from the position at which the rectified voltage is applied. Therefore, the three current detection resistors Rg1, Rg2, and Rg3 of FIG. 8 having the uniform resistance values are applied with the high rectified voltage as being far away from the position at which the rectified voltage is applied, and thus may provide the reference voltages of the switching circuits 30_1, 30_2, and 30_3 connected thereto and the detection voltage having the level meeting the turn on conditions.

The light-emitting operation of the three LED channels LED1, LED2, and LED3 of FIG. 8 will be described.

The three switching circuits 30_1, 30_2, and 30_3 compare the reference voltages VREF1, VREF2, and VREF3 applied thereto with the levels of the current detection voltage of the current detection resistors Rg1, Rg2, and Rg3 connected thereto to provide the current paths.

The three switching circuits 30_1, 30_2, and 30_3 in the initial state maintain the turned on state by a difference between the current detection voltage formed in the current detection resistors Rg1, Rg2, and Rg3 and the reference voltages VREF1, VREF2, and VREF3 applied thereto.

However, since the rectified voltage in the initial state does not reach the light-emitting voltage for light-emitting the LED channel LED1, the light source 12 does not emit light. Therefore, the current paths are not formed by the switching circuits 30_1, 30_2, and 30_3.

When the rectified voltage rises to reach the light-emitting voltage for light-emitting the LED channel LED1, the rectified voltage is applied to the current detection resistor Rg1 through the current path formed by the switching circuit 30_1.

That is, the switching circuit 30_1 provides the current path corresponding to the case in which the rectified voltage reaches the light-emitting voltage of the LED channel LED1 and when the current path is provided by the switching circuit 30_1, the LED channel LED1 is light-emitted.

When the LED channel LED1 is light-emitted and then the rectified voltage rises, the current inflow amount supplied to the current detection resistor Rg1 through the switching circuit 30_1 increases. As a result, the current detection voltage applied to the current detection resistor Rg1 rises. The current detection voltage applied to the current detection resistor Rg1 is not out of the level for maintaining the turned on state of the NMOS transistor 52 before the rectified voltage reaches the light-emitting voltage for light-emitting the LED channels LED1 and LED2.

Thereafter, when the rectified voltage reaches the light-emitting voltage for light-emitting the LED channels LED1 and LED2, the turned on switching circuit 30_2 provides the current path.

In this case, the current detection voltage applied to the negative (−) terminal of the comparator 50 of the switching circuit 30_1 is in a state higher than that of the reference voltage VREF1 due to the rising of the rectified voltage applied to the current detection resistor Rg1. Therefore, the switching circuit 30_1 is turned off not to provide the current path and only the switching circuit 30_2 provides the current path for light-emitting the LED channels LED1 and LED2.

As described above, the current path is changed from the switching circuit 30_1 to the switching circuit 30_2 in response to the rising of the rectified voltage and the LED channels LED1 and LED2 are light-emitted through the current path changed to the switching circuit 30_2.

When the rectified voltage rises, the LED channels LED1, LED2, and LED3 are sequentially turned on additionally one by one to the position far away from the position at which the rectified voltage is applied and the current paths are sequentially shifted to the position far away from the position at which the rectified voltage is applied.

After all the LED channels LED1, LED2, and LED3 are turned on, the rectified voltage falls.

When the rectified voltage starts to fall and then falls to the light-emitting voltage or less for light-emitting the LED channel LED3, the LED channel LED3 is quenched and the current path is formed by the switching circuit 30_2.

The LED channels LED3, LED2, and LED1 are sequentially quenched in response to the falling of the rectified voltage and the current paths are sequentially shifted to a close position from the position far away from the position at which the rectified voltage is applied.

Figure 9:
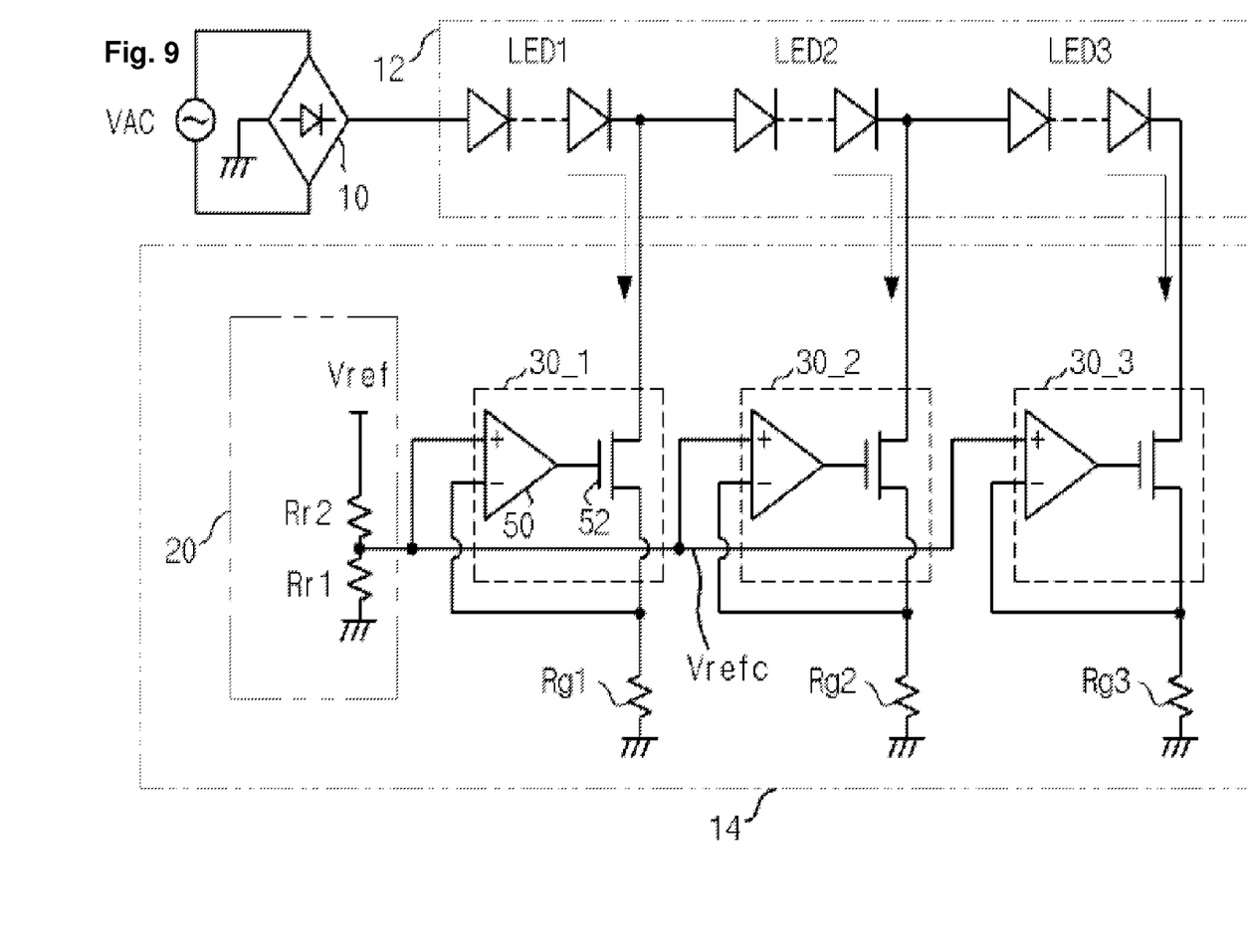
FIG. 9 is a circuit diagram illustrating an LED lighting apparatus according to another preferred embodiment of the present invention.

Further, the preferred embodiment of the present invention may be performed by a configuration adopting the uniform reference voltage and the independent current detection resistors as illustrated in FIG. 9 so as to drive the three LED channels LED1, LED2, and LED3.

The preferred embodiment of FIG. 9 is different from the preferred embodiment of FIG. 8 in terms of the configuration of the reference voltage generation circuit 20 but the remaining components of the preferred embodiment of FIG. 9 are the same as those of the preferred embodiment of FIG. 8, and therefore the configuration and operation thereof will not be repeatedly described.

In the configuration of FIG. 9, the reference voltage generation circuit 20 is configured to provide a fixed reference voltage Vrefc to each switching circuit 30_1, 30_2, and 30_3 and divide the constant voltage Vref using resistors Rr1 and Rr2 so as to output the reference voltage Vrefc.

By doing so, the three current detection resistors Rg1, Rg2, and Rg3 may have a low resistance values as being far away from the position at which the rectified voltage is applied so as to satisfy the turn on conditions for each of the switching circuits 30_1, 30_2, and 30_3.

The light-emitting voltages for each LED channels LED1, LED2, and LED3 rise as being far away from the position at which the rectified voltage is applied.

Therefore, each current detection resistors Rg1, Rg2, and Rg3 having low resistance values as being far away from the position at which the rectified voltage is applied may be applied with a high light-emitting voltage as being far away from the position at which the rectified voltage is applied to provide the current detection voltage corresponding to the fixed reference voltage Vrefc.

The light-emitting operation of the three LED channels LED1, LED2, and LED3 of FIG. 9 will be described.

The three switching circuits 30_1, 30_2, and 30_3 compare the reference voltage Vrefc with the levels of the current detection voltage of the current detection resistors Rg1, Rg2, and Rg3 connected thereto to provide the current paths.

The three switching circuits 30_1, 30_2, and 30_3 in the initial state maintain the turned on state by a difference between the current detection voltage formed in the current detection resistors Rg1, Rg2, . . . , Rg3 and the reference voltages Vrefc.

Since the rectified voltage in the initial state does not reach the light-emitting voltage for light-emitting the LED channel LED1, the light source 12 does not emit light. Further, the current paths are not also formed by the switching circuits 30_1, 30_2, and 30_3.

When the rectified voltage rises to reach the light-emitting voltage for light-emitting the LED channel LED1, the rectified voltage is applied to the current detection resistor Rg1 through the current path formed by the switching circuit 30_1.

That is, the switching circuit 30_1 provides the current path corresponding to the case in which the rectified voltage reaches the light-emitting voltage of the LED channel LED1 and when the current path is provided by the switching circuit 30_1, the LED channel LED1 is light-emitted.

When the rectified voltage is applied to the current detection resistor Rg1 through the switching circuit 30_1, the current detection voltage of the current detection resistor Rg1 rises to the level of the light-emitting voltage, and then depends on the variation of the rectified voltage.

When the LED channel LED1 is light-emitted and then the rectified voltage rises, the current inflow amount supplied to the current detection resistor Rg1 through the switching circuit 30_1 increases. As a result, the current detection voltage applied to the current detection resistor Rg1 rises. The detection voltage applied to the current detection resistor Rg1 is not out of the level for maintaining the turned on state of the NMOS transistor 52 before the rectified voltage reaches the light-emitting voltage for turning on the LED channels LED1 and LED2.

Thereafter, when the rectified voltage reaches the light-emitting voltage for turning on the LED channels LED1 and LED2, the turned on switching circuit 30_2 provides the current path.

In this case, the current detection voltage applied to the negative (−) terminal of the comparator 50 of the switching circuit 30_1 is in a state higher than that of the reference voltage Vrefc due to the rising of the rectified voltage. Therefore, the switching circuit 30_1 is turned off not to provide the current path. Therefore, only the switching circuit provides the current path for light-emitting the LED channels LED1 and LED2.

As described above, the current path is changed from the switching circuit 30_1 to the switching circuit 30_2 in response to the rising of the rectified voltage and the LED channels LED1 and LED2 are light-emitted through the current path changed to the switching circuit 30_2.

Thereafter, when the rectified voltage rises gradually, the current paths are sequentially shifted to the position far away from the position at which the rectified voltage is applied. Therefore, the LED channels LED1, LED2, and LED3 are sequentially light-emitted additionally to the position far away from the position at which the rectified voltage is applied.

After all the LED channels LED1, LED2, and LED3 are light-emitted, the rectified voltage falls.

When the rectified voltage starts to fall and then falls to the light-emitting voltage or less for light-emitting the LED channel LED3, the LED channel LED3 is turned off and the current path is formed by the switching circuit 30_2.

The LED channels LED3, LED2, and LED1 are sequentially quenched in response to the falling of the rectified voltage and the current paths are sequentially shifted to the close position from the position far away from the position at which the rectified voltage is applied.

The preferred embodiment of FIGS. 8 and 9 as described above does not use an inductor, a capacitor, and the like as well as applies the detection voltage in proportion to the input voltage to each channel, thereby securing the optimal power factor and securing the sufficient current regulating characteristics.

Further, the preferred embodiment of the present invention forms the current paths for each LED channel to simplify components configuring the LED driving circuit, such that the circuit may be implemented to have a simple structure.

As is apparent from the above description, the present invention provides a lighting apparatus which can obtain the improved power factor by excluding the inductor, the capacitor, and the like, and obtain the improved power factor and current regulation characteristics by applying the current detection voltage in proportion to the rectified voltage to the current paths for each channel.

Further, the present invention provides components configuring the LED driving circuit which can be simplified by allowing the common current detection resistor to define the current detection voltage varying in response to the rectified voltages for each LED channel, such that the LED driving circuit can be configured to have the simple structure.

In addition, the present invention provides an improved method of arranging the LED channels on the region of the substrate, such that the heat radiating efficiency and the illumination of the LED lighting apparatus can be improved.

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. An LED lighting apparatus comprising:
    a power supply unit configured to convert an AC voltage and provide a rectified voltage;
    a light source configured to include N LED channels (N is a natural number) including at least one LED; and
    a current control circuit configured to divide a varying width of the rectified voltage into N periods in response to a light-emitting voltages for each LED channel, detect a current flowing in the LED channels corresponding to the period, and control the light source to emit light by using a current detection voltage corresponding to the detected current,
    wherein the N LED channels are arranged within a predetermined region on a substrate and have a heat radiating priority determined depending on a heat value by light output and a position of the LED channels on the substrate is determined depending on the heat radiating priority.

2. The LED lighting apparatus of claim 1, wherein the current control circuit comprises:
    N switching circuits each configured to correspond to each LED channel and be connected to each LED channel in parallel to form current paths;
    a current detection resistor configured to be commonly connected between the N switching circuits and a ground to provide the current detection voltage; and
    a reference voltage generation circuit configured to provided a plurality of reference voltages having different levels corresponding to each switching circuit, and
    the N switching circuits compare the reference voltage corresponding thereto with the current detection voltage to selectively provide the current paths.

3. The LED lighting apparatus of claim 2, wherein the reference voltage generation circuit provides the reference voltage to the switching circuit connected to the LED channel having a high light-emitting voltage and provides the reference voltage to the switching circuit connected to the LED channel having a low light-emitting voltage.

4. The LED lighting apparatus of claim 2, wherein the N switching circuits gradually shift a position of the current path to the LED channel having the high light-emitting voltage when the rectified voltage rises and gradually shift a position of the current path to the LED channel having the low light-emitting voltage when the rectified voltage falls.

5. The LED lighting apparatus of claim 2, wherein the N switching circuits comprise:
    a comparator configured to compare the reference voltage with the current detection voltage to output the compared results; and
    a switching element configured to turn on/off the current path between the LED channel connected to thereto and the current detection resistor in response to an output of the comparator.

6. The LED lighting apparatus of claim 1, wherein the current control circuit comprises:

N switching circuits each configured to correspond to each LED channel and be connected to each LED channel in parallel to form current paths;

N current detection resistors configured to be independently connected between the N switching circuits and a ground to provide the current detection voltage; and a reference voltage generation circuit configured to provide a plurality of reference voltages corresponding to each switching circuit, and the N switching circuits compare the reference voltage corresponding thereto with the current detection voltage to selectively provide the current paths.

7. The LED lighting apparatus of claim 6, wherein the N current detection resistors have uniform resistance values so as to satisfy turn on conditions for each of the N switching circuits.

8. The LED lighting apparatus of claim 6, wherein the reference voltage generation circuit provides the reference voltage to the switching circuit connected to the LED channel having a high light-emitting voltage and provides the reference voltage to the switching circuit connected to the LED channel having a low light-emitting voltage.

9. The LED lighting apparatus of claim 1, wherein the current control circuit comprises:

N switching circuits configured to correspond to each LED channel and be connected to each LED channel in parallel to form current paths;

N current detection resistors configured to independently connect between the N switching circuits and a ground to provide the current detection voltage;

a reference voltage generation circuit configured to commonly provide a reference voltage having a fixed level to the N switching circuits, and the N switching circuits compare the reference voltage with the current detection voltage corresponding thereto to selectively provide the current paths.

10. The LED lighting apparatus of claim 9, wherein the N current detection resistors have low resistance values as being far away from a position at which the rectified voltage is applied.

11. The LED lighting apparatus of claim 1, wherein the LED channel having the high heat radiating priority is arranged at an outer side and the LED channel having the low heat radiating priority is arranged in an inner side.

12. The LED lighting apparatus of claim 1, wherein the light source comprises first to third LED channels connected to each other in series and the second LED channel is disposed between the first LED channel and the third LED channel.

13. The LED lighting apparatus of claim 1, wherein the LED channels are disposed in a helical form within the region.

14. The LED lighting apparatus of claim 1, wherein the LED channels are disposed so that spacing between the LEDs included in an LED channel located at an outer side is gradually wider than spacing between the LED channels included in an LED channel located in an inner side.

15. A LED lighting apparatus comprising:

a light source configured to include N LED channels (N is a natural number) including at least one LED configured in series, the N LED channels being arranged in each region on a substrate depending to a heat radiating priority and the heat radiating priority being determined depending on a heat value by light output; and a current regulating circuit configured to provide current paths for the N LED channels at different positions in response to a variation of a rectified voltage provided to the light source, wherein the current regulating circuit comprises:

N switching circuits configured to be connected to each output terminal of the N LED channels in parallel to form the current paths;

N current detection resistors configured to be independently connected to the N switching circuits and a ground to provide a current detection voltage; and a reference voltage generation circuit configured to generate and provide reference voltages having different levels for each of the N switching circuits, and the N switching circuits compare their own reference voltage with the current detection voltage corresponding thereto to selectively provide the current paths.

16. An LED lighting apparatus comprising:

a light source configured to include N LED channels (N is a natural number) including at least one LED configured in series, the N LED channels being arranged in each region on a substrate depending to a heat radiating priority and the heat radiating priority being determined depending on a heat value by light output; and a current regulating circuit configured to provide current paths for the N LED channels at different positions in response to a variation of a rectified voltage provided to the light source, wherein the current regulating circuit comprises:

N switching circuits configured to be connected to each output terminal of the N LED channels in parallel to form the current paths;

N current detection resistors configured to be independently connected to the N switching circuits and a ground to provide a current detection voltage; and a reference voltage generation circuit configured to commonly provide a reference voltage having a fixed level to each switching circuit, and the N switching circuits compare the reference voltage with the current detection voltage corresponding thereto to selectively provide the current paths.

* * * * *